US009224749B1

(12) United States Patent
Guo et al.

(10) Patent No.: US 9,224,749 B1
(45) Date of Patent: Dec. 29, 2015

(54) METHOD FOR FILLING POLYSILICON GATE IN SEMICONDUCTOR DEVICES, AND SEMICONDUCTOR DEVICES

(71) Applicant: MACRONIX INTERNATIONAL CO., LTD., Hsinchu (TW)

(72) Inventors: Jung-Yi Guo, Tainan (TW); Chun-Min Cheng, Hsinchu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 0 days.

(21) Appl. No.: 14/296,226

(22) Filed: Jun. 4, 2014

(51) Int. Cl.
*H01L 27/10* (2006.01)
*H01L 27/115* (2006.01)
*H01L 29/66* (2006.01)

(52) U.S. Cl.
CPC .... *H01L 27/11578* (2013.01); *H01L 29/66833* (2013.01)

(58) Field of Classification Search
CPC .......................... H01L 27/0207; H01L 23/528

USPC .......................................................... 257/211
See application file for complete search history.

(56) References Cited

U.S. PATENT DOCUMENTS

| 2004/0094793 | A1* | 5/2004 | Noguchi et al. ............... 257/315 |
| 2007/0210265 | A1* | 9/2007 | Haq et al. .................... 250/493.1 |
| 2009/0278193 | A1* | 11/2009 | Murata et al. ................. 257/324 |

\* cited by examiner

*Primary Examiner* — Theresa T. Doan
(74) *Attorney, Agent, or Firm* — Baker & McKenzie LLP

(57) ABSTRACT

Present example embodiments relate generally to semiconductor devices and methods of fabricating a semiconductor device comprising forming an insulating base layer over a surface of a substrate. The method further comprises forming a multilayer over the insulating base layer, the multilayer having conducting and insulating layers. The method further comprises etching a pattern in the multilayer and forming a charge storage layer over the patterned multilayer. The method further comprises forming a protective silicon layer over the charge storage layer, followed by performing a heat treatment process.

11 Claims, 11 Drawing Sheets

METHOD FOR FILLING POLYSILICON GATE IN SEMICONDUCTOR DEVICES, AND SEMICONDUCTOR DEVICES

BACKGROUND

The present disclosure relates generally to semiconductor structures, and more specifically, relates to semiconductor devices, including 3D vertical gate (VG) NAND devices, and methods of fabricating semiconductor devices, including 3D vertical gate (VG) NAND devices.

There is an ever growing need by semiconductor device manufacturers to further shrink the critical dimensions of semiconductor devices, to achieve greater storage capacity in smaller areas, and to do so at lower cost per bit. Three-dimensional (3D) semiconductor devices using, for example, thin film transistor (TFT) techniques, charge trapping memory techniques, and cross-point array techniques, have been increasingly applied to achieve the above needs by semiconductor manufacturers. Recent developments in semiconductor technology include the forming of vertical NAND cells using charge-trapping memory technology, in which a multi-gate field effect transistor structure having a vertical channel operating like a NAND gate uses silicon-oxide-nitride-oxide-silicon (SONOS) charge trapping technology to create a storage site at each gate/vertical channel interface. Recent developments have achieved reduced critical dimensions, greater storage, and reduced associated manufacturing costs for three-dimensional semiconductor devices by forming stacks of strips of alternating conductive material separated by insulating material and providing memory elements in interface regions between conductive materials of the stacks.

BRIEF SUMMARY

Despite recent developments in the fabrication of semiconductor devices, it is recognized in the present disclosure that one or more problems may be encountered in fabricated three-dimensional semiconductor devices. For example, in the formation of the various layers and structures of the semiconductor device, one or more undesirable voids are oftentimes formed in an interior of the semiconductor device structure. Such voids are typically formed between sensitive internal structures and subsequently formed polysilicon layer (s). Sensitive internal structures may include charge storage structures, such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer. If the voids are formed close to and/or in contact with the sensitive internal structure or close to and/or in contact with a polysilicon layer formed over the sensitive internal structure, then such voids may cause undesirable and possibly catastrophic problems to the semiconductor device and/or its performance. Even if the voids are not formed close to the sensitive internal structure or close to the polysilicon layer subsequently formed over the sensitive internal structure, a high temperature annealing process performed after the formation of the subsequently formed polysilicon layer(s) oftentimes causes the voids to shift, change in shape, change in size, divide, combine with other voids, and/or migrate towards the sensitive internal structure or the subsequently formed polysilicon layer resulting in the aforementioned undesirable and possibly catastrophic problems to the semiconductor device and/or its performance.

Present example embodiments relate generally to semiconductor devices and methods of fabricating semiconductor devices that address one or more problems in fabricated semiconductor devices, including those described above.

In an exemplary embodiment, a method of fabricating a semiconductor device is described in the present disclosure comprising forming an insulating base layer over a surface of a substrate. The method further comprises forming a multilayer over the insulating base layer, the multilayer having conducting and insulating layers. The method further comprises etching a pattern in the multilayer and forming a charge storage layer over the patterned multilayer. The method further comprises forming a protective silicon layer over the charge storage layer, followed by performing a heat treatment process. The protective silicon layer is operable to isolate the charge storage structure and a first polysilicon layer formed over the charge storage structure from a void formable after the formation of a second polysilicon layer. The protective silicon layer is also operable to protect the charge storage layer from a void formable as a result of at least one polysilicon layer subsequently formed over the charge storage layer. The protective silicon layer is also operable to protect the charge storage layer from a change to a void (such as a shift, a change in size, a change in shape, a dividing, a combining with other voids, and/or a migrating towards the charge storage layer) resulting from the heat treatment process, the void formable as a result of at least one polysilicon layer subsequently formed over the charge storage layer.

In another exemplary embodiment, a semiconductor device is described in the present disclosure, the semiconductor device comprising a substrate, an insulating base layer formed over the substrate, a patterned multilayer structure of alternating conductive and insulating layers formed over the insulating base layer, a charge storage structure formed over the patterned multilayer structure, and a protective silicon layer formed over the charge storage structure. The protective silicon layer is operable to isolate the charge storage structure and a first polysilicon layer formed over the charge storage structure from a void formable after the formation of a second polysilicon layer. The protective silicon layer is also operable to protect the charge storage structure from a void formable as a result of at least one polysilicon layer subsequently formed over the charge storage structure. The protective silicon layer is also operable to protect the charge storage structure from a change to a void resulting from a heat treatment process, the void formable as a result of at least one polysilicon layer subsequently formed over the charge storage structure.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and.

Although similar reference numbers may be used to refer to similar elements in the figures for convenience, it can be appreciated that each of the various example embodiments may be considered to be distinct variations.

DETAILED DESCRIPTION

Example embodiments will now be described with reference to the accompanying drawings, which form a part of the present disclosure, and which illustrate example embodiments which may be practiced. As used in the present disclosure and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used in the present disclosure and the appended claims is for the purpose of describing example embodiments only and is not intended to be limitations. In this respect, as used in the present disclosure and the appended claims, the term "in" may include "in" and "on," and the terms "a," "an" and "the" may include singular and plural references. Furthermore, as used in the present disclosure and the appended claims, the term "by" may also mean "from," depending on the context. Furthermore, as used in the present disclosure and the appended claims, the term "if" may also mean "when" or "upon," depending on the context. Furthermore, as used in the present disclosure and the appended claims, the words "and/or" may refer to and encompass any and all possible combinations of one or more of the associated listed items.

Despite recent developments in the fabrication of semiconductor devices, it is recognized in the present disclosure that one or more problems may be encountered in fabricated semiconductor devices. For example, one or more voids are oftentimes undesirably formed in an interior of the semiconductor device structure. Such voids are typically formed somewhere within and/or between internal structures and subsequently formed polysilicon layer(s). Internal structures may include charge storage structures, such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer.

Figure 1:
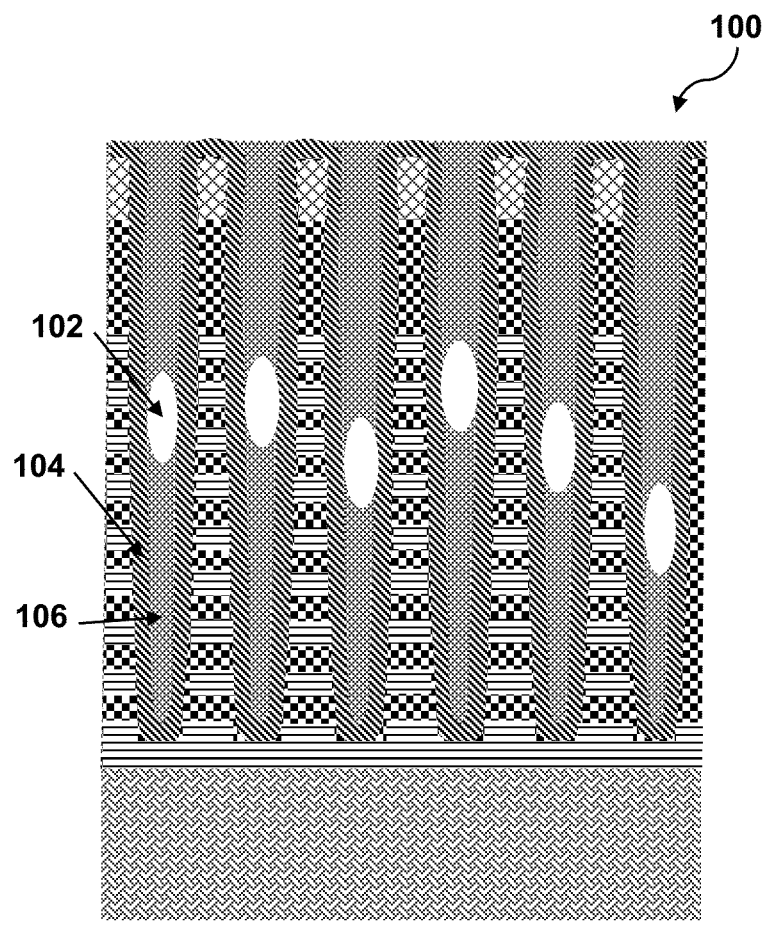
FIG. 1 is an example illustration of a cross-section of a fabricated semiconductor device including an occurrence of voids.
Figure 2:
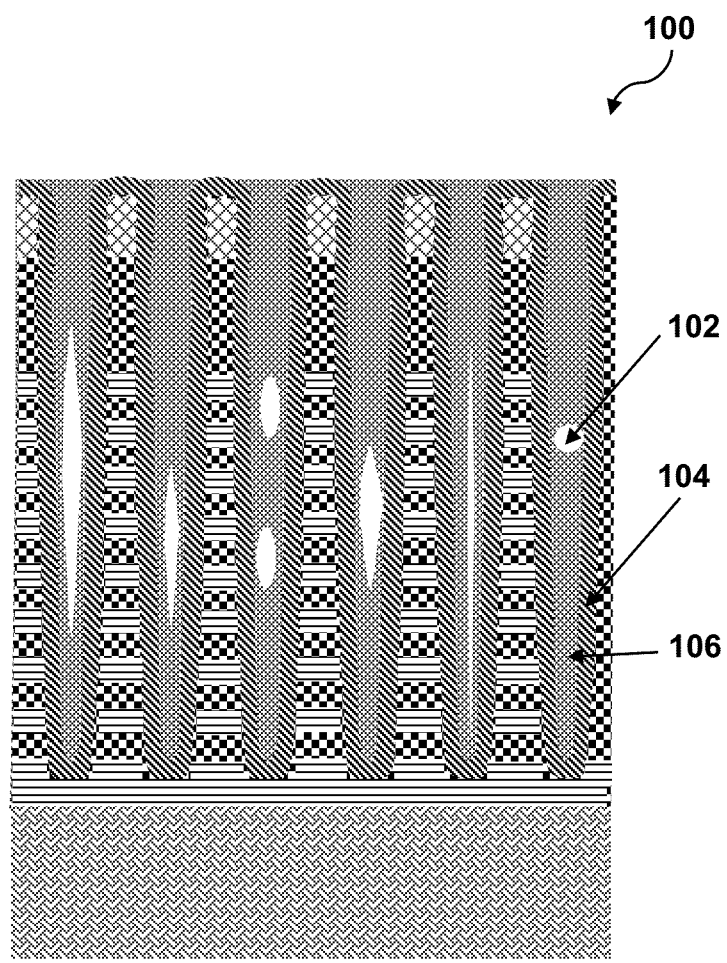
FIG. 2 is another example illustration of a cross-section of a fabricated semiconductor device including an occurrence of voids.
Figure 3:
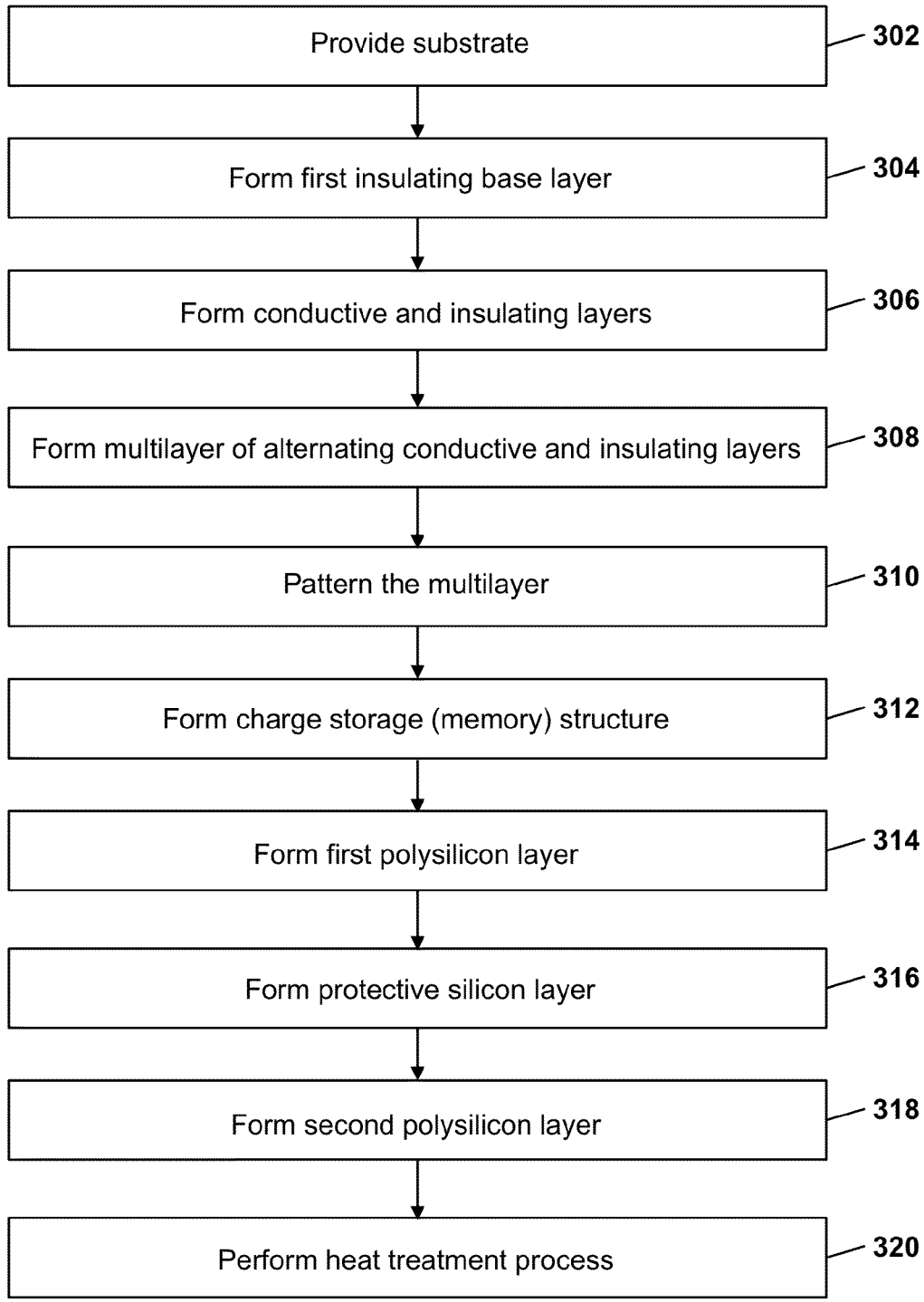
FIG. 3 is a flow diagram of an exemplary method for fabricating a semiconductor device.

For example, one or more voids 102 may form between an internal structure 104 and a single polysilicon layer 106 subsequently formed over the internal structure 104 to fill the semiconductor device 100, as illustrated in FIGS. 1 and 2. If the one or more voids 102 are formed close to and/or in contact with the internal structure 104 and/or within the polysilicon layer 106, then the one or more voids 102 may cause undesirable and possibly catastrophic problems to the semiconductor device 100 and/or its performance, including the inability for a gate layer to control the memory cell and an increase in interference between adjacent bit lines. Even if the voids 102 are not formed close to the internal structure 104, a high temperature annealing process performed after the formation of the subsequently formed polysilicon layer 104 oftentimes causes one or more of the voids 102 to change, including shifting, changing in shape, changing in size, dividing, combining with other voids, and/or migrating towards the internal structure 104, resulting in the aforementioned undesirable and possibly catastrophic problems to the semiconductor device 100 and/or its performance.

As another example (not shown), if a first polysilicon layer is formed over an internal structure and a second polysilicon layer is formed to complete the filling of the semiconductor device, then a void may form between the first and second polysilicon layers and/or within the second polysilicon layer. If the voids are formed close to and/or in contact with the first polysilicon layer, then such voids may cause undesirable and possibly catastrophic problems to the semiconductor device and/or its performance, including the inability for a gate layer to control the memory cell and an increase in interference between adjacent bit lines. Even if the voids are not formed close to the first polysilicon layer, an annealing process performed after the formation of the second polysilicon layer may oftentimes cause one or more of the voids to change, including shifting, changing in shape, changing in size, dividing, combining with other voids, and/or migrating towards the first polysilicon layer and/or cause new voids to form close to and/or in contact with the first polysilicon layer, resulting in the aforementioned undesirable and possibly catastrophic problems to the semiconductor device and/or its performance.

Semiconductor devices, including three-dimensional vertical gate (VG) NAND devices, and methods of fabricating semiconductor devices are described in the present disclosure for addressing one or more problems discovered in semiconductor devices, including those described above. It is to be understood in the present disclosure that the principles described can be applied outside the context of NAND-type devices described in exemplary embodiments, including floating gate memory devices, charge trapping memory devices, non-volatile memory devices, and/or embedded memory devices.

An example embodiment of a process of fabricating an example embodiment of a semiconductor device, such as a three-dimensional vertical gate (VG) NAND device, is depicted in FIGS. 3-11. As illustrated in the sequence of steps of FIG. 3, the process may include providing a substrate at action 302, forming a first insulating base layer on the substrate at action 304, and forming a conductive layer and an insulating layer at action 306. The process may further include forming a multilayer (or stack) of alternating conductive and insulating layers at action 308, and patterning the multilayer (or stack) at action 310. The process may further include forming a charge storage structure at action 312, forming a first polysilicon layer at action 314, forming a protective silicon layer at action 316, forming a second polysilicon layer at action 318, and performing a heat treatment process at action 320. A three-dimensional vertical gate (VG) NAND device may be fabricated according to one or more of the above actions, which may also include additional actions, may be performable in different sequences, and one or more of the actions may be combinable into a single action or divided into two or more actions. Semiconductor devices other than NAND-type devices are also contemplated in example embodiments.

Figure 4:
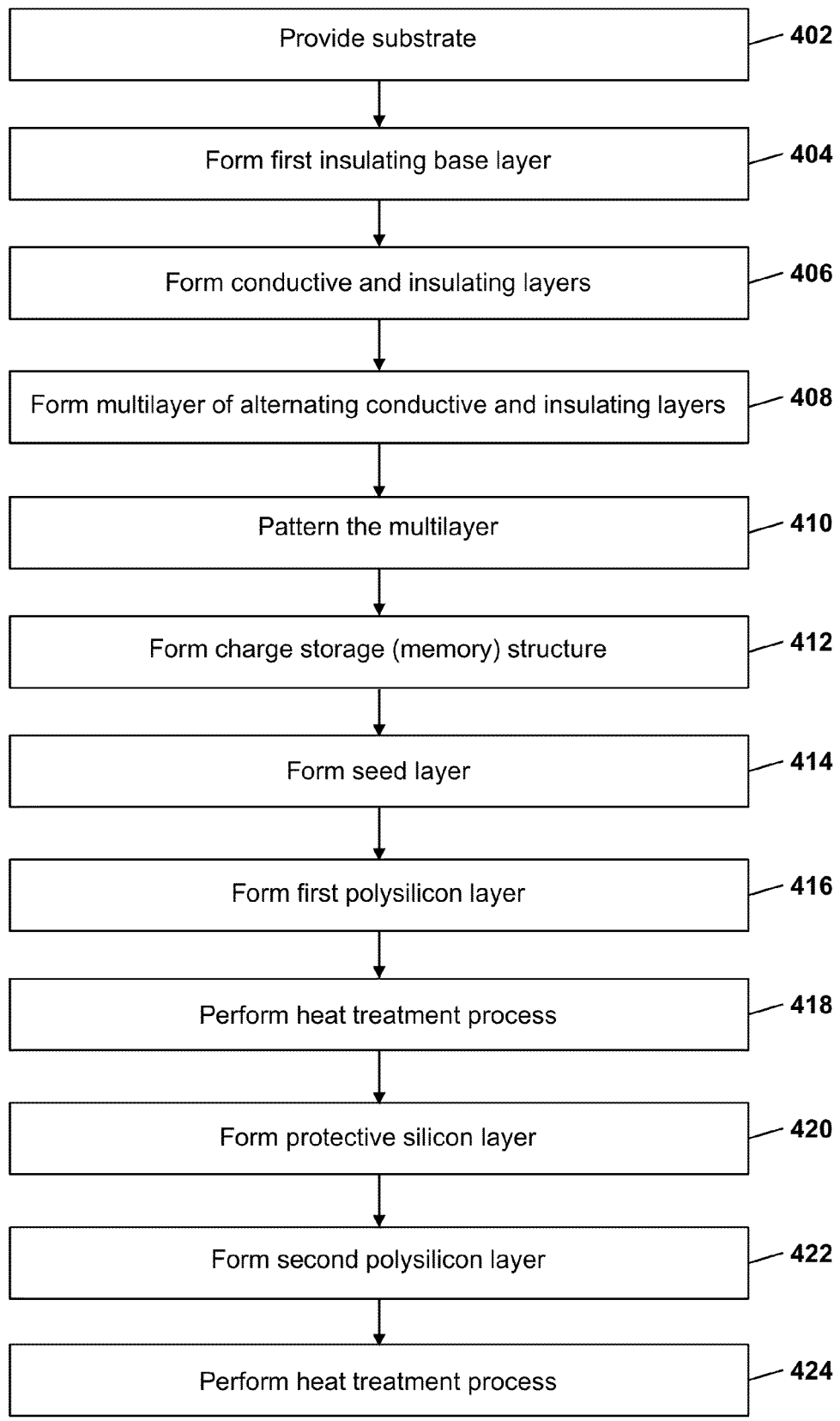
FIG. 4 is another flow diagram of an exemplary method for fabricating a semiconductor device.

FIG. 4 illustrates another sequence of actions including providing a substrate at action 302, forming a first insulating base layer on the substrate at action 304, and forming a conductive layer and an insulating layer at action 306. The process may further include forming a multilayer (or stack) of alternating conductive and insulating layers at action 308, and patterning the multilayer (or stack) at action 310. The process may further include forming a charge storage structure at action 312, forming a seed layer at action 313, forming a first polysilicon layer at action 314, optionally performing a heat treatment process after the forming of the first polysilicon layer at action 315, forming a protective silicon layer at action 316, forming a second polysilicon layer at action 318, and performing a heat treatment process at action 320. A three-dimensional vertical gate (VG) NAND device may be fabricated according to one or more of the above actions, which may also include additional actions, may be performable in different sequences, and one or more of the actions may be combinable into a single action or divided into two or more actions. Semiconductor devices other than NAND-type devices are also contemplated in example embodiments. These processes will now be described with references to FIGS. 3-11.

(1) Providing a substrate (e.g., action 302).

Substrates 502 suitable for use in semiconductor devices may be obtained by any one of many manufacturing methods, such as pressing methods, float methods, down-drawn methods, redrawing methods, fusion methods, or the like.

(2) Forming a first insulating base layer (e.g., action 304).

Figure 5:
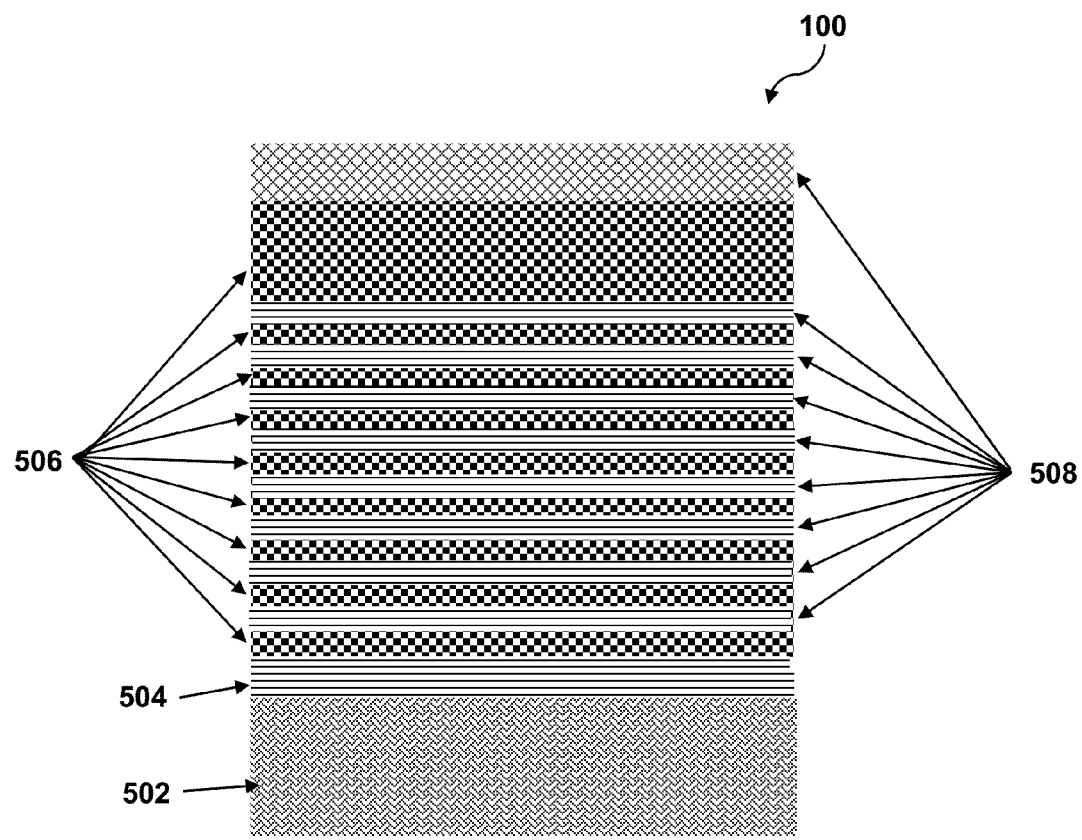
FIG. 5 is a cross-sectional illustration of an example embodiment of a multilayer formed over an insulating layer.

A substrate 502 obtained from the above action 302 may be provided with an insulating base layer 504 thereon, as illustrated in the cross-sectional view of FIG. 5. The insulating base layer 504 may be operable to isolate the substrate 502 from the next layer 506 (as described in No. 3 below) and act as an etch stop in a subsequent patterning process at action 510 (as described in No. 5 below). The insulating base layer 504 formed may be about 2000 Angstroms in thickness. It is recognized herein that the insulating base layer 504 may be any desired thickness, including about 1000-4000 Angstroms in thickness.

(3) Forming a conductive layer and an insulating layer (e.g., action 306).

As illustrated in the cross-sectional view of FIG. 5, a substantially crystalline conductive polysilicon layer 506 may be formed on the insulating base layer 504. The thickness of the conductive polysilicon layer 506 may be about 200 Angstroms. It is recognized herein that the thickness of the conductive polysilicon layer 506 may be about 100-300 Angstroms in example embodiments.

Thereafter, an insulating layer 508 may be formed on the conductive polysilicon layer 506. The thickness of the insulating layer 508 may be about 800 Angstroms. It is recognized herein that the thickness of the insulating layer 508 may be about 100-1000 Angstroms in example embodiments.

(4) Forming a multilayer (or stack) of alternating conductive and insulating layers (e.g., action 308).

As illustrated in the cross-sectional view of FIG. 5, a multilayer (or stack) of alternating conductive polysilicon layers 506 and insulating layers 508 may be formed.

In example embodiments, a multilayer of 16 alternating polysilicon layers 506 and insulating layers 508 may be formed. It is to be understood herein that the number of alternating polysilicon layers 506 and insulating layers 508 formed in the multilayer may be greater than or less than 16 in example embodiments.

(5) Patterning the multilayer (or stack) (e.g., action 310).

Figure 6:
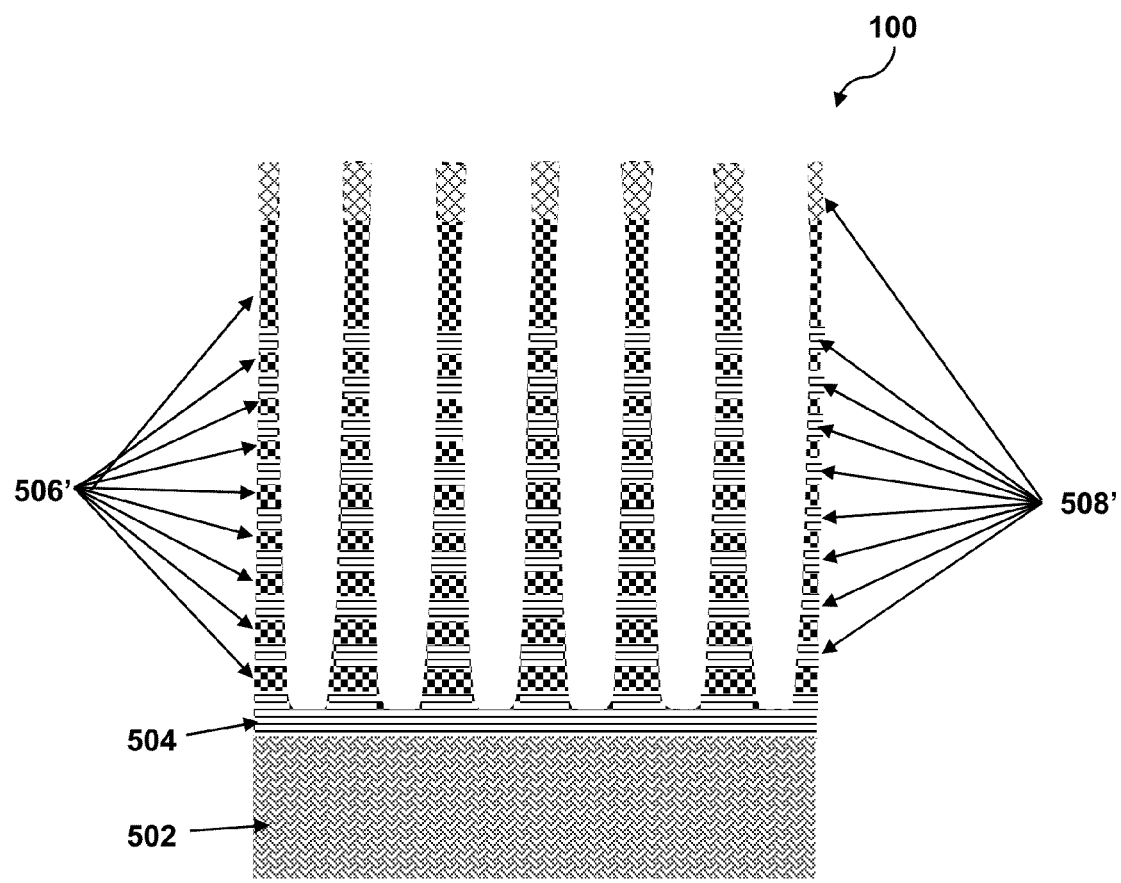
FIG. 6 is a cross-sectional illustration of an example embodiment of a patterned multilayer.

The multilayer of alternating conductive layers 506 and insulating layers 508 obtained by the above No. 4 (e.g., actions 306 and 308) may then be subjected to a patterning process 310, resulting in a patterned multilayer of alternating conductive layers 506' and insulating layers 508', as illustrated in the cross-sectional view of FIG. 6. In performing the patterning action 310, a photolithography process may be used by applying a photoresist mask (not shown) having pre-formed patterns and etching the alternating conductive layers 506 and insulating layers 508 according to the pre-formed patterns on the photoresist mask. As previously explained, the insulating base layer 504 may be operable to provide an etch stop and therefore the insulating base layer 504 may not be etched. A multilayer (or stack) of patterned conductive layers 506' and insulating layers 508' may be obtained, as illustrated in the cross-sectional view of FIG. 6.

(6) Forming a charge storage structure (e.g., action 312)

Figure 7:
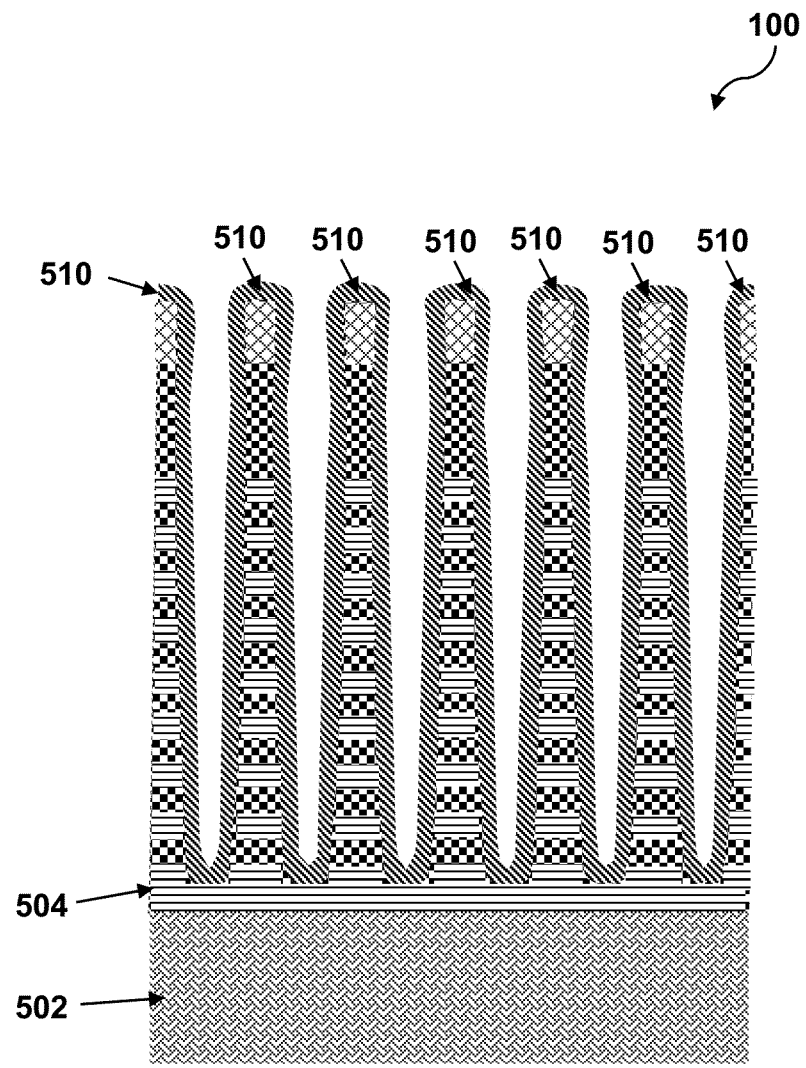
FIG. 7 is a cross-sectional illustration of an example embodiment of a charge storage layer formed over a patterned multilayer.

As illustrated in the cross-sectional view of FIG. 7, an internal charge storage or memory structure 510 may then be formed over the patterned multilayer obtained by action 310 above. The internal charge structure 510 may include silicon-oxide-nitride-oxide-silicon (SONOS) or BE-SONOS structures comprising a tunneling dielectric layer, a trapping layer, and a blocking oxide layer. The tunneling dielectric layer may comprise oxide, nitride, and oxide sub-layers and/or a composite of materials forming an inverted "U" shaped valence band under zero bias voltage; the trapping layer may comprise nitride; and the blocking oxide or gate layer may comprise oxide. The tunneling dielectric layer may further include a hole tunneling layer (not shown), a band offset layer (not shown), and an isolation layer (not shown). Other internal structures are also contemplated in this disclosure, including those for floating gate memory, charge trapping memory, NAND-type devices, semiconductor devices other than NAND-type devices, non-volative memory devices, and/or embedded memory devices.

(7) Forming a seed layer (e.g., action 313)

Before forming a first polysilicon layer 514 (as described in No. 8 below) over the charge storage structure 510, a thin seed layer 512 may be deposited over the charge storage structure 510 to assist with the formation of the subsequent first polysilicon layer 514. The seed layer 512 may be formed by providing a seed layer precursor comprising di-isopropyl-amino-silane (DIPAS), $Si_2H_6$, and/or $SiH_4$ and applying process conditions including a temperature of about 450-750 Celsius and a pressure of about 1 mtorr to 500 torr. In example embodiments, the seed layer 512 is formed having a thickness of about 10-100 Angstroms.

(8) Forming a first polysilicon layer (e.g., action 314)

Figure 8:
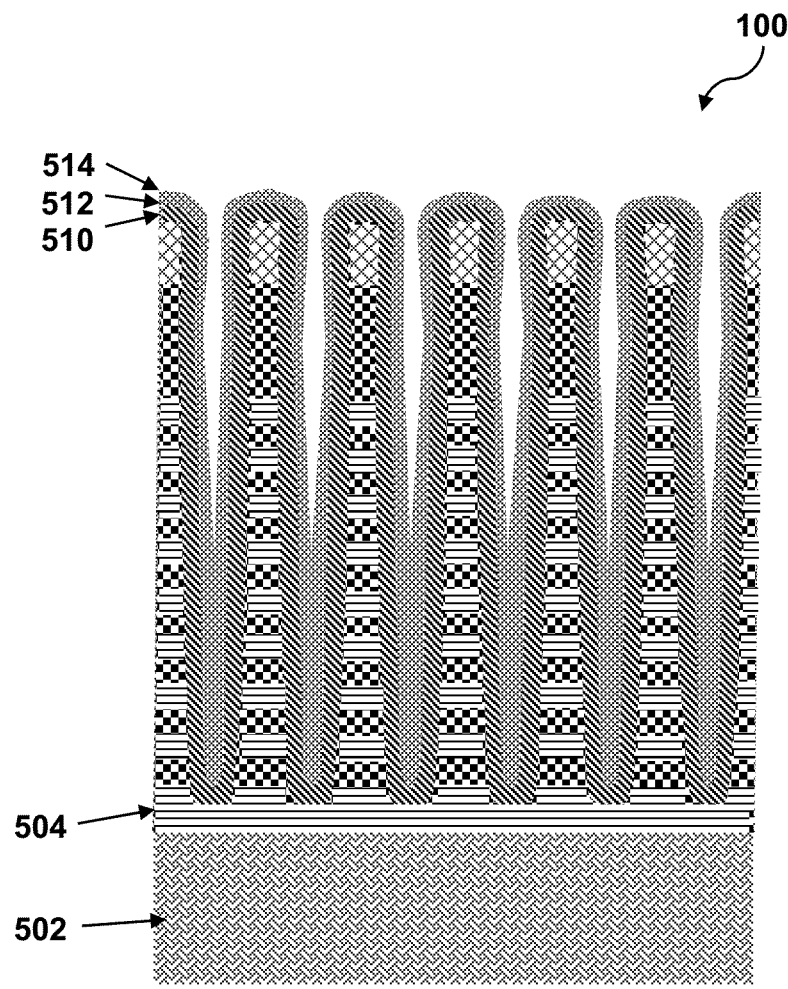
FIG. 8 is a cross-sectional illustration of an example embodiment of a seed layer and a first polysilicon layer formed over a charge storage layer.

A first polysilicon layer 514 may be formed over a thin seed layer 512 deposited over the charge storage structure 510, as illustrated in the cross-sectional view of FIG. 8. It is to be understood in the present disclosure that the first polysilicon layer 514 may be formable directly on the charge storage structure 510 in example embodiments. The first polysilicon layer 514 may be formed by providing a first polysilicon layer precursor comprising $B_2H_6$, $Si_2H_6$, and/or $SiH_4$ and applying process conditions including a temperature of about 450-750 Celsius and a pressure of about 1 mtorr to 500 torr. In example embodiments, the first polysilicon layer 514 is formed having a thickness of about 10-300 Angstroms.

(9) Performing a heat treatment process after forming the first polysilicon layer (e.g., action 315)

After the formation of the first polysilicon layer 514, a heat treatment process (e.g., action 315), such as an RTP annealing process, may be selectively performed as needed. In example embodiments, the annealing is performed for a duration of 1-60 seconds and at a temperature of about 600-1000 Celsius and a pressure of about 100 mtorr to 760 torr. It is to be understood in the present disclosure that the heat treatment process (e.g., action 315) may or may not be performed in example embodiments.

(10) Forming a protective silicon layer (e.g., action 316)

Figure 9:
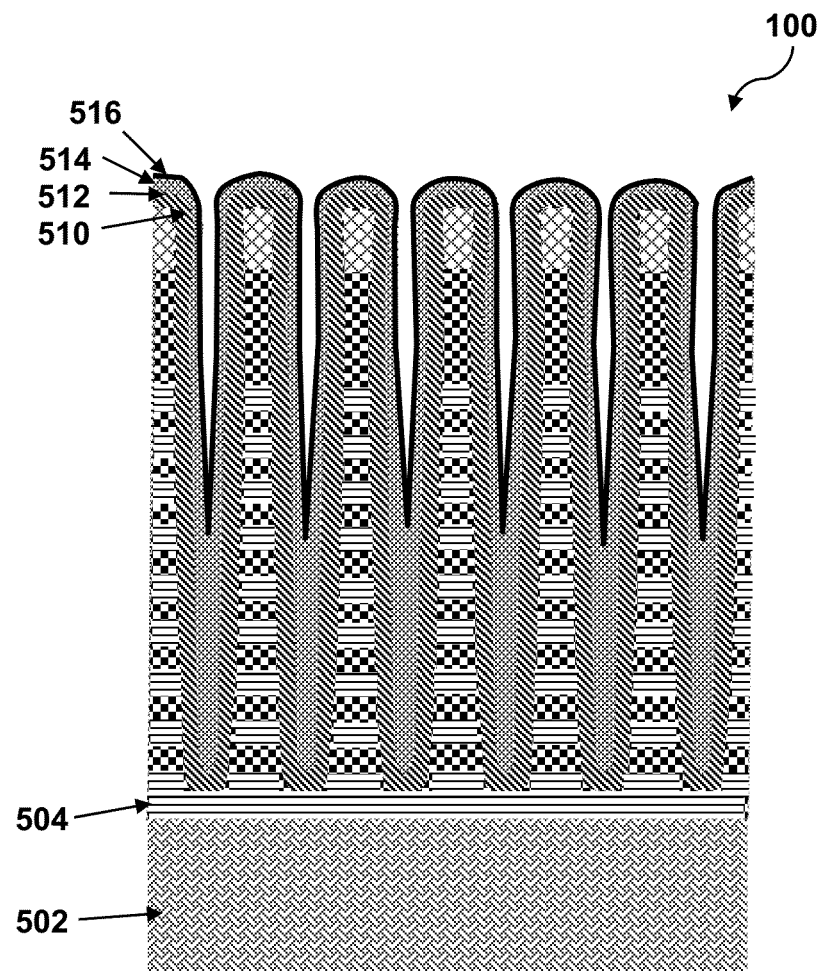
FIG. 9 is a cross-sectional illustration of an example embodiment of a protective silicon layer formed over a first polysilicon layer.

A protective silicon layer 516 may be formed over the first polysilicon layer 514, as illustrated in the cross-sectional view of FIG. 9. The protective silicon layer 516 may be formed by providing a protective silicon layer precursor comprising carbon, $C_2H_4$, $B_2H_6$, $Si_2H_6$, and/or $SiH_4$. In example embodiments, the protective silicon layer 516 is a thin carbon-added $P^+$ polysilicon layer. In example embodiments, the protective silicon layer 516 is formed by applying process conditions including a temperature of about 450-750 Celsius and a pressure of about 1 mtorr to 500 torr. In example embodiments, the protective silicon layer 516 is formed having a thickness of about 10-100 Angstroms.

As described above and illustrated in FIGS. 1, 2, and 10, one or more voids 102 may form at or near an outer surface of the first polysilicon layer 514 after the formation of the second polysilicon layer 518 (as described in No. 11 below). Furthermore, the one or more voids 102 formed may change, including shifting, changing shape, changing size, dividing, combining with other voids, and/or migrating towards the surface of the first polysilicon layer 514, during and/or as a result of performing a heat treatment process (as described in No. 12 below), or the like. It is recognized in the present disclosure that such voids 102 formed close to and/or in contact with the outer surface of the first polysilicon layer 514 may cause undesirable and possibly catastrophic problems to the fabricated semiconductor device and/or its performance. In example embodiments, the protective silicon layer 516 is operable to isolate, prevent, and/or block the one or more voids 102 and/or changes to the one or more voids 102 from causing undesirable effects to the first polysilicon layer 514, the charge storage layer 510, and/or the fabricated semiconductor device.

(11) Forming a second polysilicon layer (e.g., action 318)

Figure 10:
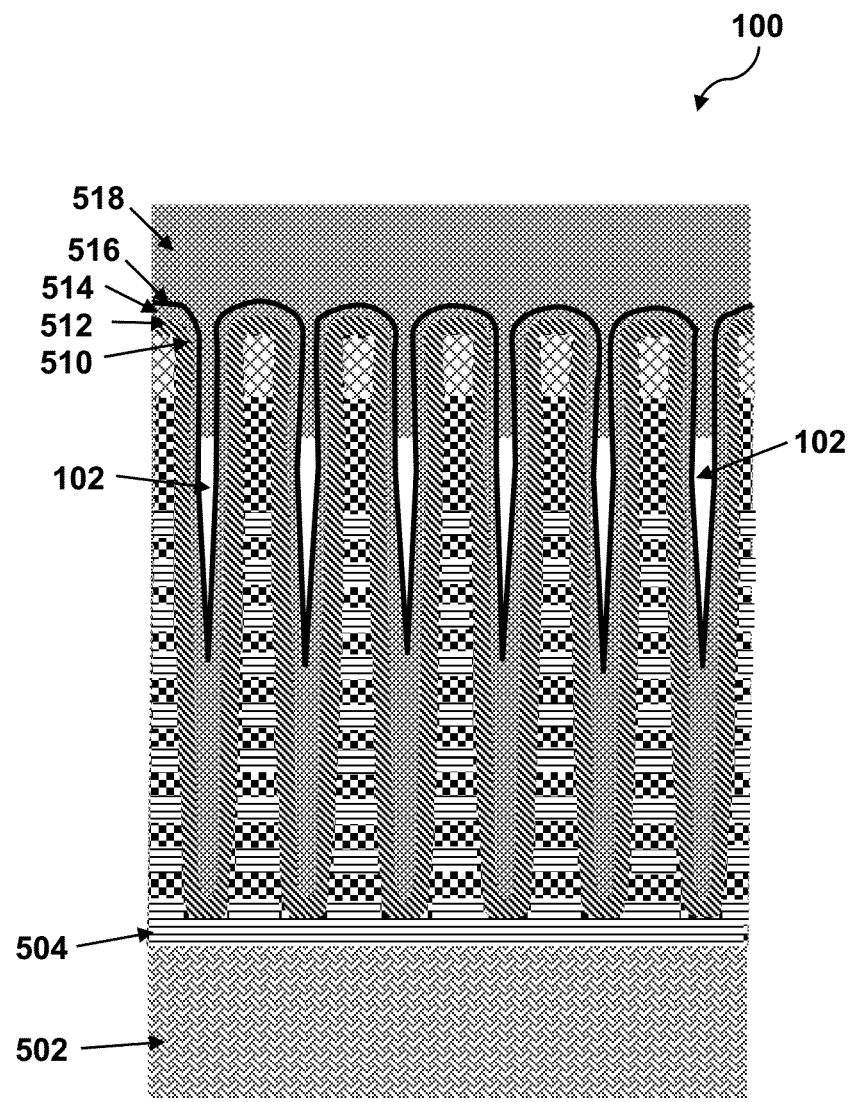
FIG. 10 is a cross-sectional illustration of an example embodiment of a second polysilicon layer formed over at least a portion of the protective silicon layer.

A second polysilicon layer 518 may be formed over at least a portion of the protective silicon layer 516, as illustrated in the cross-sectional view of FIG. 10. The second polysilicon layer 518 may be formed by providing a second polysilicon layer precursor comprising $B_2H_6$, $Si_2H_6$, and/or $SiH_4$ and applying process conditions including a temperature of about 450-750 Celsius and a pressure of about 1 mtorr to 500 torr. In example embodiments, the second polysilicon layer 518 is formed having a thickness of about 100 to 1200 Angstroms. As illustrated in the cross-sectional view of FIG. 10, one or more voids 102 may be formed (and subsequently changed, including shifting, changing in shape, changing in size, dividing, combining with other voids, and/or migrating towards the first polysilicon layer 514) after the formation of the second polysilicon layer 518. Without the protective silicon layer 516, the one or more voids 102 formed and/or changed between the first polysilicon layer 514 and the second polysilicon layer 518 and near or at the surface of the first polysilicon layer 514 may cause undesirable effects and/or problems to the fabricated semiconductor device and/or its performance. With the protective silicon layer 516, the one or more voids 102 and the changes to the one or more voids 102 may be isolated, blocked, and/or prevented from causing undesirable effects and/or problems to the first polysilicon layer 514, the charge storage structure 510, and/or the fabricated semiconductor device 100.

(12) Performing a heat treatment process (e.g., action 320)

The semiconductor device obtained after the formation of the second polysilicon layer 518 may then be subjected to a heat treatment process. In example embodiments, the heat treatment process may be a high temperature annealing process with process conditions including a temperature of about 600-1000 Celsius and for a duration of about 10-60 seconds. As described above, the heat treatment process (e.g., action 320) may cause one or more voids 102 formed after the formation of the second polysilicon layer 518 to change, including shifting, changing in shape, changing in size, dividing, combining with other voids, and/or migrating towards the first polysilicon layer 514, during and/or as a result of performing the heat treatment process (e.g., action 320).

Figure 11:
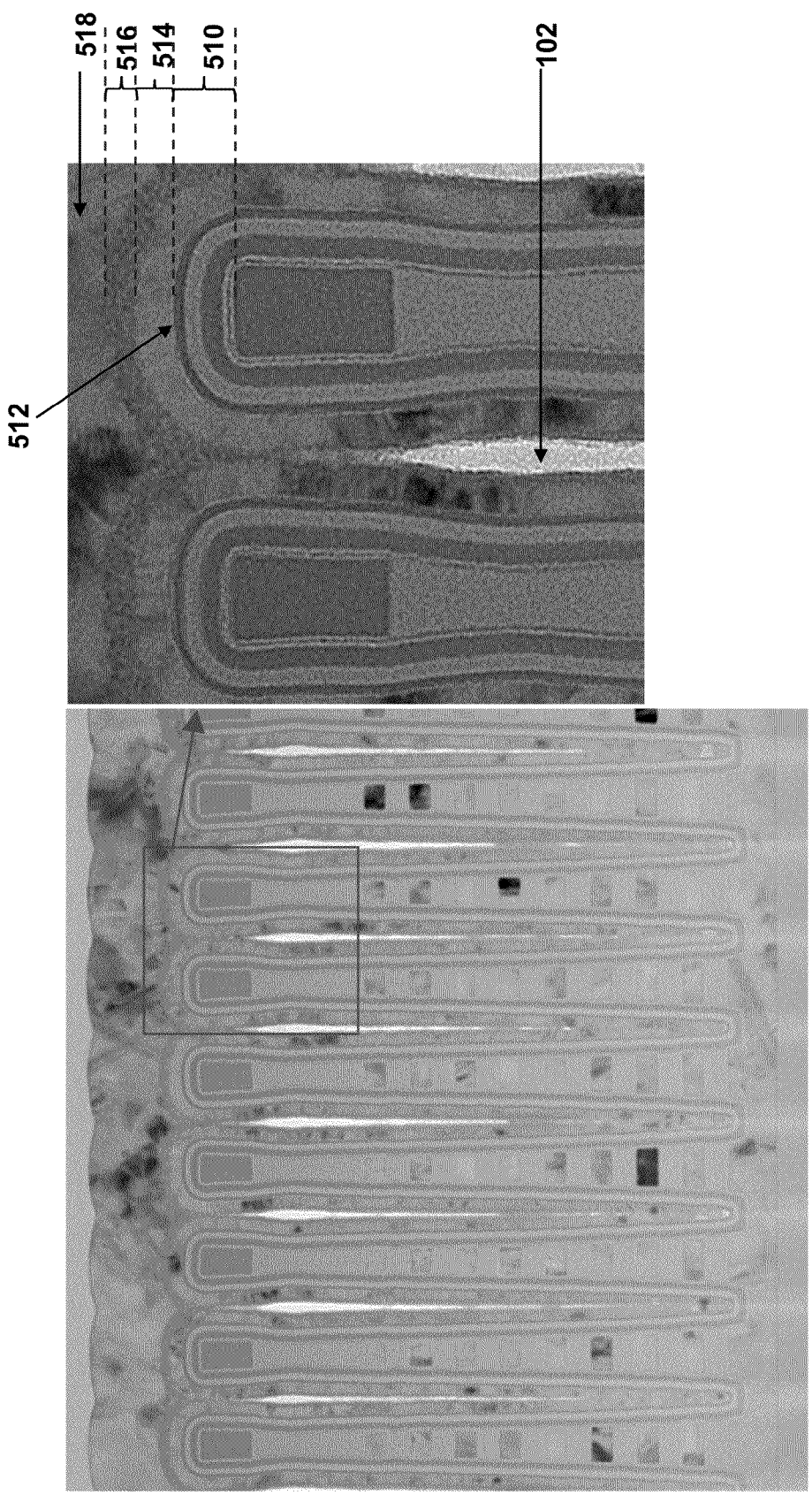
FIG. 11 is a cross-sectional illustration of an example embodiment of a semiconductor device.

FIG. 11 is a cross-sectional illustration of an example embodiment of a semiconductor device 100 comprising a substrate suitable for use in semiconductor devices, an insulating base layer formed over the substrate, and a patterned multilayer (or stack) of alternating conducting layers and insulating layers formed over the insulating base layer. A charge storage structure 510 is formed over the patterned multilayer, and a seed layer 512 is formed over the charge storage structure 510 to assist with the formation of a subsequent first polysilicon layer 514. It is to be understood that the first polysilicon layer 514 may be formed directly over the charge storage structure 510 in example embodiments. A thin carbon-added protective silicon layer 516 is formed over the first polysilicon layer 514 and a second polysilicon layer 518 is formed over at least a portion of the protective silicon layer 516. It is to be understood in the present disclosure that principles described can be applied outside the context of NAND-type devices described in exemplary embodiments, including floating gate memory devices, charge trapping memory devices, non-volatile memory devices, and/or embedded memory devices.

While various embodiments in accordance with the disclosed principles have been described above, it should be understood that they have been presented by way of example only, and are not limiting. Thus, the breadth and scope of the example embodiments described in the present disclosure should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

For example, as referred to in the present disclosure, "forming" a layer, multilayer, and/or structure may include any method of creating the layer, multilayer, and/or structure, including depositing and the like. A "multilayer" may be one layer, structure, and/or stack comprising a plurality of internal layers and/or a plurality of layers, multilayers, structures, and/or stacks stacked or formed on or over one another. Internal structures may include any internal structure of a semiconductor device, including charge storage structures such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer.

Although one or more layers, multilayers, and/or structures may be described in the present disclosure as being "silicon," "polysilicon," "conductive," "oxide," and/or "insulative" layers, multilayers, and/or structures, it is to be understood that example embodiments may be applied for other materials and/or compositions of the layers, multilayers, and/or structures. Furthermore, such structures may be in the form of a crystalline structure and/or amorphous structure in example embodiments.

Furthermore, "patterning" of one or more layers, multilayers, and/or structures may include any method of creating a desired pattern on the one or more layers, multilayers, and/or structures, including performing a photolithography process by applying a photoresist mask (not shown) having pre-formed patterns and etching the layers, multilayers, and/or structures according to the pre-formed patterns on the photoresist mask.

"Voids" formed in material(s), layer(s), and/or between materials and/or layers may include openings, bores, gaps, voids, cracks, holes, bubbles, and the like, comprising air, other gases, and/or compositions other than the material and/or compositions of its surrounding material and/or layer(s), and/or a mixture thereof. Furthermore, although the present disclosure describes example embodiments for addressing "voids," the claimed approaches described in the present disclosure may also be beneficially applicable to address and/or improve other performance-related problems and/or issues, including formation, shifting, changing in size, changing in shape, changing in composition, combining, dividing, and/or migrating of other types of imperfections in the semiconductor fabrication process.

It is to be understood in the present disclosure that the principles described can be applied outside the context of NAND-type devices described in exemplary embodiments, including NOR-type devices, other memory storage devices, floating gate memory devices, charge trapping memory devices, non-volatile memory devices, and/or embedded memory devices.

Various terms used herein have special meanings within the present technical field. Whether a particular term should be construed as such a "term of art" depends on the context in which that term is used. "Connected to," "forming on," "forming over," or other similar terms should generally be construed broadly to include situations where formations, depositions, and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A semiconductor device comprising:
   a substrate;
   an insulating base layer formed over the substrate;
   a patterned multilayer structure of alternating conductive and insulating layers formed over the insulating base layer;
   a charge storage structure formed over the patterned multilayer structure, the charge storage structure having a tunneling layer, a charge trapping layer, and a blocking layer;
   a seed layer over the charge storage structure;
   a first polysilicon layer formed over the seed layer; and
   a protective silicon layer formed over the first polysilicon layer.

2. The semiconductor device of claim 1, wherein the first polysilicon layer has a thickness of about 10-300 Angstroms.

3. The semiconductor device of claim 1, further comprising a second polysilicon layer over at least a portion of the protective silicon layer.

4. The semiconductor device of claim 3, wherein the second polysilicon layer has a thickness of about 100-1200 Angstroms.

5. The semiconductor device of claim 1, wherein the seed layer is operable to assist with the forming of the first polysilicon layer.

6. The semiconductor device of claim 1, wherein the protective silicon layer comprises carbon.

7. The semiconductor device of claim 1, wherein the protective silicon layer has a thickness of about 10-100 Angstroms.

8. The semiconductor device of claim 1, wherein the semiconductor device is a 3D vertical gate (VG) NAND device.

9. The semiconductor device of claim 1, wherein the protective silicon layer is operable to isolate the first polysilicon layer from a void formable after the forming of the second polysilicon layer.

10. The semiconductor device of claim 1, wherein the protective silicon layer is operable to protect the charge storage structure from a void formable as a result of at least one polysilicon layer subsequently formed over the charge storage structure.

11. The semiconductor device of claim 1, wherein the protective silicon layer is operable to protect the charge storage structure from a change to a void resulting from a heat treatment process, the void formable as a result of at least one polysilicon layer subsequently formed over the charge storage structure.

* * * * *